(12) United States Patent  
Wan

(10) Patent No.: US 7,429,495 B2
(45) Date of Patent: Sep. 30, 2008

(54) SYSTEM AND METHOD OF FABRICATING MICRO CAVITIES

(75) Inventor: Chang-Feng Wan, 16210 Shadybank Dr., Dallas, TX (US) 75248

(73) Assignee: Chang-Feng Wan, Dallas, TX (US)

(*) Notice: Subject to any disclaimer, the term of this patent is extended or adjusted under 35 U.S.C. 154(b) by 275 days.

(21) Appl. No.: 10/712,196

(22) Filed: Nov. 13, 2003

(65) Prior Publication Data

US 2005/0017313 A1    Jan. 27, 2005

Related U.S. Application Data

(63) Continuation-in-part of application No. 10/213,564, filed on Aug. 7, 2002, now abandoned.

(60) Provisional application No. 60/454,152, filed on Mar. 12, 2003, provisional application No. 60/452,421, filed on Mar. 6, 2003, provisional application No. 60/448,846, filed on Feb. 20, 2003, provisional application No. 60/426,871, filed on Nov. 18, 2002.

(51) Int. Cl.
*H01L 21/00* (2006.01)

(52) U.S. Cl. .................................. 438/53; 438/456

(58) Field of Classification Search ............. 438/50–53, 438/455–459; 257/415, 419–420
See application file for complete search history.

(56) References Cited

U.S. PATENT DOCUMENTS

| | | |
|---|---|---|
| 4,990,229 A | 2/1991 | Campbell et al. |
| 5,242,863 A | 9/1993 | Xiang-Zheng et al. |
| 5,397,962 A | 3/1995 | Moslehi |
| 5,448,068 A | 9/1995 | Lee et al. |
| 5,486,491 A | 1/1996 | Sengupta et al. ............. 501/137 |
| 5,493,177 A | 2/1996 | Muller et al. |
| 5,550,090 A | 8/1996 | Ristic et al. |
| 5,593,495 A | 1/1997 | Masuda et al. ................. 117/4 |
| 5,640,042 A | 6/1997 | Koscica et al. .............. 257/595 |
| 5,694,134 A | 12/1997 | Barnes ....................... 343/700 |
| 5,801,383 A | 9/1998 | Wada et al. |
| 5,886,867 A | 3/1999 | Chivukula et al. .......... 361/311 |
| 5,891,751 A | 4/1999 | Kurtz et al. |
| 5,921,461 A | 7/1999 | Kennedy et al. |
| 5,929,497 A | 7/1999 | Chavan et al. |
| 5,990,766 A | 11/1999 | Zhang et al. ................. 333/205 |
| 6,060,336 A | 5/2000 | Wan |
| 6,074,971 A | 6/2000 | Chiu et al. ................... 501/139 |

(Continued)

OTHER PUBLICATIONS

. J. Yao et al. IEEE J. MEMS vol. 8(2), 1999, pp. 129-134.

(Continued)

*Primary Examiner*—Sara Crane

(57) ABSTRACT

A system and method for manufacturing micro cavities at the wafer level using a unique, innovative MEMS (MicroElectroMechanical Systems) process, wherein micro cavities are formed, with epoxy bonded single-crystalline silicon membrane as cap and deposited and/or electroplated metal as sidewall, on substrate wafers. The epoxy is also the sacrificial layer. It is removed from within the cavity through small etch access holes etched in the silicon cap before the etch access holes are sealed under vacuum. The micro cavities manufactured therein can be used as pressure sensors or for packaging MEMS devices under vacuum or inert environment. In addition, the silicon membrane manufactured therein can be used to manufacture RF switches.

18 Claims, 19 Drawing Sheets

U.S. PATENT DOCUMENTS

| | | | |
|---|---|---|---|
| 6,093,579 A | 7/2000 | Sathe | |
| 6,117,787 A | 9/2000 | Park | |
| 6,135,856 A | 10/2000 | Tjaden et al. | |
| 6,258,223 B1 | 7/2001 | Cheung et al. | |
| 6,262,417 B1 | 7/2001 | Ju | |
| 6,284,149 B1 | 9/2001 | Li et al. | |
| 6,294,425 B1 | 9/2001 | Hideki | |
| 6,377,142 B1 | 4/2002 | Chiu et al. | 333/238 |
| 6,377,217 B1 | 4/2002 | Zhu et al. | 343/700 |
| 6,377,440 B1 | 4/2002 | Zhu et al. | 361/311 |
| 6,404,614 B1 | 6/2002 | Zhu et al. | 361/277 |
| 6,440,289 B1 | 8/2002 | Woo et al. | |
| 6,492,883 B2 | 12/2002 | Liang et al. | 333/132 |
| 6,514,895 B1 | 2/2003 | Chiu et al. | 501/137 |
| 6,525,630 B1 | 2/2003 | Zhu et al. | 333/205 |
| 6,534,850 B2 | 3/2003 | Liebeskind | |
| 6,535,076 B2 | 3/2003 | Partridge et al. | 333/17.1 |
| 6,543,292 B1 | 4/2003 | Colton et al. | |
| 6,547,973 B2 | 4/2003 | Field | |
| 6,556,102 B1 | 4/2003 | Sengupta et al. | 333/161 |
| 6,570,750 B1 | 5/2003 | Calcatera et al. | |
| 6,590,468 B2 | 7/2003 | du Toit et al. | 333/17.3 |
| 6,593,242 B2 | 7/2003 | Morgenstern | |
| 6,597,265 B2 | 7/2003 | Liang et al. | 333/204 |
| 2004/0219706 A1* | 11/2004 | Wan | 438/53 |

OTHER PUBLICATIONS

S. P. Pacheco et al. IEEE MTT-S Int. Microwave Symp. Dig., Boston, MA, Jun. 2000, pp. 165-167.

C.F. Wan, F.C. Suizbach, and J.D. Luttmer, "TiNxOy transparent electrode material for HgCdTe infrared devices". J.Vac.Sci Technol. vol. 10. No. 4. Jul./Aug. 1992.

* cited by examiner

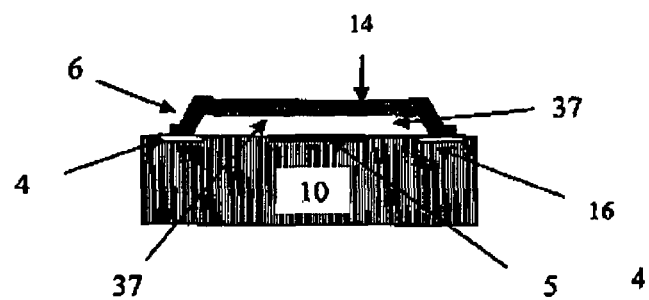
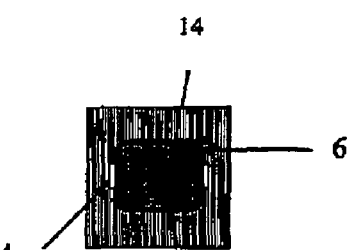
FIG. 2a  FIG. 2b
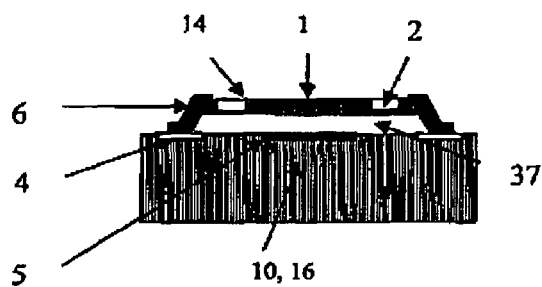
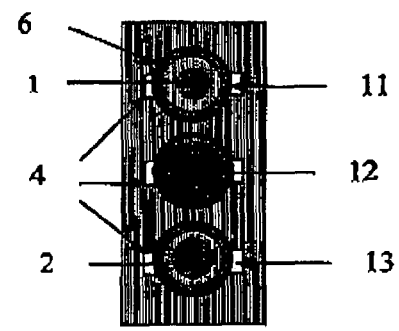
FIG. 3a  FIG. 3b
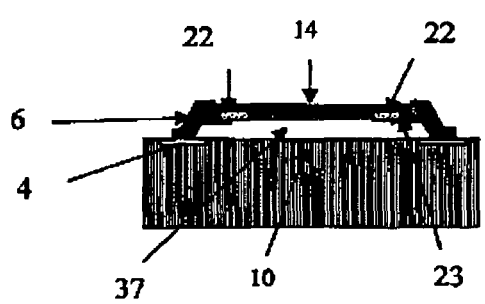
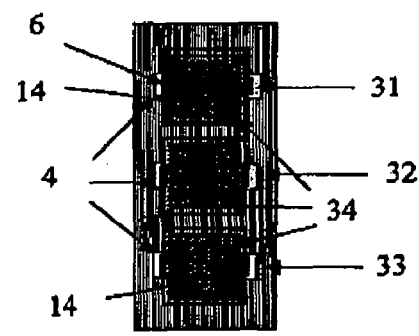
FIG. 4a  FIG. 4b

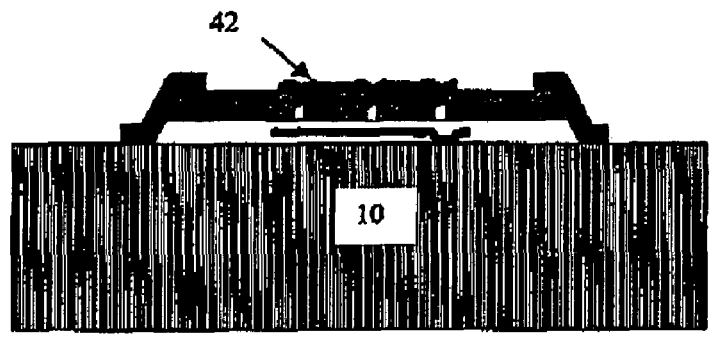
FIG. 6i
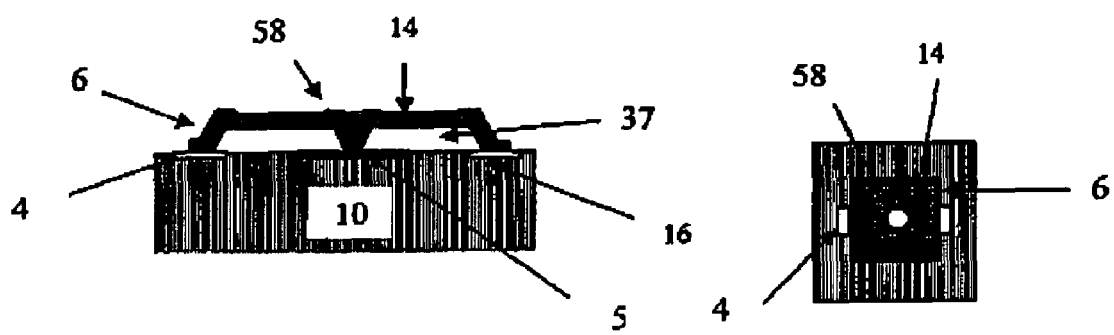 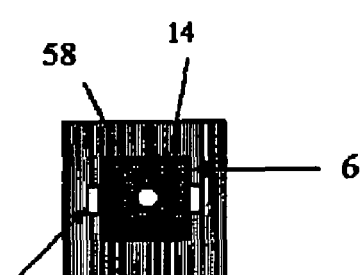
FIG. 7a                FIG. 7b

SYSTEM AND METHOD OF FABRICATING MICRO CAVITIES

CROSS REFERENCE TO RELATED APPLICATIONS

This is a continuation in part application of patent application Ser. No. 10/213,564, filed Aug. 7, 2002 now abandoned and entitled "A Microelectromechanical Device made from Mono-crytalline silicon and method of manufacture therefore," which is incorporated by reference in its entirety, and claims the benefit of provisional patent application Nos. 60/426,871, filing date Nov. 18, 2002, and 60/448,846, with a filing date Feb. 20, 2003, and 60/452,421, with a filing date of Mar. 06, 2003, and 60/454,152, with a filing date Mar. 12, 2003.

BACKGROUND OF THE INVENTION

1. Field of the Invention

The present invention is related to methods for manufacturing micro cavities or enclosures at the wafer level using MEMS (Micro-Electro-Mechanical Systems) processes, specifically to pressure sensors and hermetic or vacuum packaging of electronics devices.

2. Description of Related Art

With increasing developments in Micro-Electro-Mechanical Systems (MEMS), miniature sensors are filling the horizon. However, significant deterrents to military and commercial application of many of these devices exist. Of primary concern for almost all MEMS sensors to date is the issue of packaging where they must be packaging in vacuum or hermetic environment. The vacuum or hermetic packaging often takes more than 50% of the total cost of a MEMS device. This is especially true for vacuum packaging, which is used for packaging inertial sensors (for lower Brownian noise introduced by gas molecules), infrared detectors (for heat insulation), and radio-frequency (RF) MEMS devices such as RF switches and mechanical resonators.

Wafer-scale packaging, where all the devices on a wafer is packaged at the same time, is the key to lowering the cost of vacuum packaging for MEMS devices as all the sensors on the wafer are packaged at the same time. A prevalent approach to wafer scale packaging is to bond a capping wafer, which have cavities, to the device wafer, under vacuum, to seal individual MEMS chips on the device wafer in the cavities. The bonding may be done with glass-to-silicon anodic bonding, with electroplated solder, with screen-printed low melting-point glass frit, or with preformed Au—Sn. To prevent out-gassing that occurs with time and degrades the vacuum, metal gas getters are often used to absorb the out-gassed gas while spacers may be needed to control the gap between the wafers.

Several other wafer bonding techniques can be used for wafer level packaging. They include:
(1) direct silicon wafer bonding at high temperatures;
(2) Pyrex-silicon anodic bonding;
(3) silicon-silicon anodic bonding with sputtered intermediate Pyrex layers;
(4) silicon-silicon bonding using intermediate boron glass layers; or
(5) low-temperature wafer bonding using sodium silicate or aluminum phosphate intermediate thin layers.

These techniques, however, have the following drawbacks:
(1) Direct silicon wafer bonding requires high temperatures (800-1100° C.) that is detrimental to most microelectronic devices;
(2) Glass-silicon anodic bonding are restricted to glass substrates which has different coefficient of thermal expansion (CTE) than silicon and can cause deformation after bonding;
(3) Anodic bonding requires a high DC voltage that can cause threshold voltage shift in the CMOS transistors;
(4) The intermediate boron glass layers are difficult to deposit and to etch; and
(5) Anodic bonding requires very clean and flat surfaces in the wafers, which make metal feedunders difficult to implement.

Micro cavities fabricated with MEMS technology have been used as pressure sensors, where one side of the cavity's enclosure is a thin membrane, which deflects if the pressures on two sides of it are different, and the opposite side is a rigid substrate. There is a gap $g_o$ between the membrane and the substrate. The principle of operation for typical pressure sensors is depicted in FIG. 1 (PRIOR ART). The strain 1040 in the membrane or the variation of gap thickness 1020 is a direct consequence of the membrane deflection 1010 caused by pressure 1000. These are two parameters that can be detected 1030 by a sensing device. In general these pressure sensors can be divided into four categories in terms of their sensing mechanisms: Piezoelectric, Piezoresistive, Capacitive and Optical. Most of the commercial pressure sensors are piezoresistive sensors. Silicon and germanium show greater piezoresistive effect than metals. Polysilicon and amorphous silicon also exhibit a strong piezoresistive effect. The sensing resistors are typically P-ion implantations in a n-type substrate. These resistors are diffused into the areas of high strain for maximum sensitivity. The basic structure of a piezoresistive pressure sensor consists of four sense elements in a Wheatstone bridge configuration to measure strain within a thin silicon membrane.

For the capacitive pressure sensors, capacitive sensors are used for gap thickness measurement. Deflection of one of the membranes/electrodes would modify the capacitance, which results in a variation of capacitance versus pressure. Absolute pressure sensors, which measures the difference between zero pressure (a perfect vacuum) and some known pressure, uses vacuum in the cavity to provide the absolute pressure reference. Many MEMS piezoresistive pressure sensors employ silicon-to-glass wafer bonding, which bonds a silicon wafer having bulk micromachined cavities and diaphragms, to a glass wafer under vacuum, to form the vacuum cavities.

Fabrication of capacitive pressure sensor is compatible with CMOS, thus it is more suitable for SoC architecture. Unfortunately, the fabrication process for such integrated pressure sensors has been very complex and expensive, thus it has not seen popularity. This technique is not compatible with CMOS as high voltage and temperature are involved. Polysilicon membrane enclosed vacuum cavities have been used in both piezoresistive and capacitive pressure sensors, their fabrication process also involves high temperatures.

Gas getter is normally used in vacuum packages to getter gases for preventing degradation of the vacuum with time. One example of gas gettering is barium metal used in vacuum tube or cathode ray tube that is evaporated from an electrical heating filament to the wall, when gas molecules in the vacuum chamber react with the metal and is trapped on the wall. A common way to getter gas in a vacuum package is electrically fired getter, where the getter is attached to an electrical heater and placed inside the package. It is heated up by passing electricity through the heater to activate the getter. Another method of activating the getter is to heat the entire vacuum package to a certain required temperature for a certain require period of time. Such getter is a metal mixture prepared in thick film format, so it cannot be deposited and thus must be placed inside the vacuum package individually by hand or tools. This is laborious and requires substantial amount of space and, thus, is undesirable for small packages. A getter that allows it to be deposited in thin film format is needed for batch processing. In addition, one that does not require high temperature activation is also needed.

BRIEF DESCRIPTION OF THE INVENTION

The present invention is a system and method of making small enclosures on a substrate wafer. This is accomplished by bonding a cap wafer to the substrate wafer with an adhesive layer; thinning the cap wafer to desired thickness; patterning and etching the cap wafer and the adhesive to form islands of layers of the cap wafer and the adhesive on the substrate wafer; and patterning and depositing at least one metal layer on the islands to form a sidewall around the islands. The method can also include patterning and etching etch access holes in the cap wafer of the islands; removing the adhesive through the etch access holes; and sealing the etch access holes with deposited films. Also, in the step of patterning and etching the cap wafer and the adhesive to form islands of layers of the cap wafer and the adhesive on the substrate wafer, the step of patterning and etching a center boss in the cap wafer can be included. Also, the step of patterning and etching the cap wafer and the adhesive to form islands of layers of the cap wafer and the adhesive on the substrate wafer can be accomplished with high density plasma that contains hydrogen and argon. The substrate wafer can include electronic readout circuits and electrical components.

The present invention also describes in detail Microcavities formed on a substrate wafer for use in microelectronic circuits or MEMS devices which are comprised of a cap wafer bonded to the substrate wafer with an adhesive layer; the cap wafer thinned to a desired thickness; the cap wafer and the adhesive patterned and etched to form islands of layers of the cap wafer and the adhesive on the substrate wafer; and at least one metal layer patterned and deposited on said islands to form a sidewall around said islands.

The present invention also provides for a system for making small enclosures on a substrate wafer. That system comprises a means for bonding a cap wafer to the substrate wafer with an adhesive layer, a means for thinning the cap wafer to desired thickness, a means for patterning and etching the cap wafer and the adhesive to form islands of layers of the cap wafer and the adhesive on the substrate wafer, and a means patterning and depositing at least one metal layer on the islands to form a sidewall around the islands.

The present invention also provides for a system for making electrostatic actuators or RF switches on a substrate wafer and packaging them. That system comprises a means for planarizing a substrate wafer with an adhesive layer, a means for lapping the adhesive layer to achieve desired smoothness, before bonding a cap wafer and thinning the cap wafer to desired thickness.

The present invention also provides for a system for making electrostatic actuators or RF switches having distinct or continuous settings that are selectable by applying appropriate voltages on one or a set of fixed electrodes that form stairs or slopes.

The present invention also provides for a electrostatic actuators or RF switches having distinct or continuous settings that are selectable by applying appropriate voltages on one or a set of fixed electrodes that form stairs or slopes.

Finally, the present invention provides for a system for making tunable Fabry-Perot filters or varactors having distinct or continuous settings that are selectable by applying appropriate voltages on one or a set of fixed electrodes that form stairs or slopes.

BRIEF DESCRIPTION OF THE DRAWINGS

A more complete understanding of the present invention may be had by reference to the following detailed description when taken in conjunction with the accompanying drawings wherein:

FIG. 2a is a cross sectional view of a micro cavity embodiment capable of being made by the system and method of the present invention;

FIG. 2b is a top view of a micro cavity embodiment capable of being made by the system and method of the present invention;

FIG. 3a is a cross sectional view of the preferred pressure sensor die of the present invention;

FIG. 3b is a top view of the preferred pressure sensor die of the present invention;

FIG. 4a is a cross sectional view of the preferred pressure sensor die of the present invention;

FIG. 4b is a top view of the preferred pressure sensor die of the present invention;

FIGS. 6a to 6i respectively depict cross sectional views, showing a particular portion of a microstructure during specific phases of the fabrication process of a micro cavity for packaging a MEMS microstructure in a vacuum enclosure.

FIG. 7a is a cross sectional view of a micro cavity embodiment having a support post in the middle capable of being made by the system and method of the present invention;

FIG. 7b is a top view of a micro cavity embodiment having a support post in the middle capable of being made by the system and method of the present invention;

FIG. 12b is a top view of the stepping electrostatic actuator and micro switch of FIG. 12a;

FIG. 13b is a cross sectional view of the stepping electrostatic actuator or micro switch in FIG. 13a, in an actuated state, where the second suspended electrode is pulled-in;

FIG. 14c is a top view of the analog electrostatic actuator in FIG. 14a.

DETAILED DESCRIPTION OF THE DRAWINGS

Figure 1:
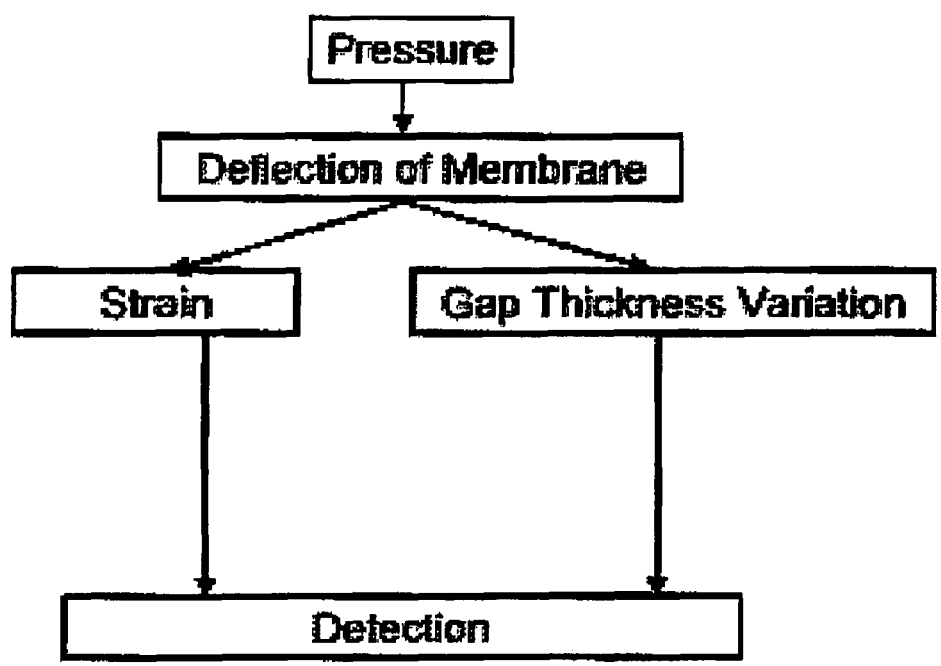
FIG. 1 (PRIOR ART) depicts the principle of operation for typical pressure sensors.

Referring to the drawings, reference is made to FIG. 2a and FIG. 2b, wherein the micro cavity embodiment that the present invention of fabrication process is capable of making is depicted in top view (FIG. 2a) and cross section view (FIG. 2b). The micro vacuum cavity 37 is formed with silicon membrane 14 as cap, metal 6 as sidewall and integrated circuits 16 as substrate 10. Contact 4 on integrated circuits 16 makes electrical contact to metal 6, which in turn makes electrical contact to silicon membrane 14. Electrode 5 on integrated circuits 16 and silicon membrane 14 form a sense capacitor.

Referring now to FIG. 5a to FIG. 5g, there is depicted cross sectional views showing a particular portion of a microstructure during specific phases of the fabrication process for the vacuum cavity 3 in FIG. 2. The thickness and gaps are not shown to scale.

Figure 5A:
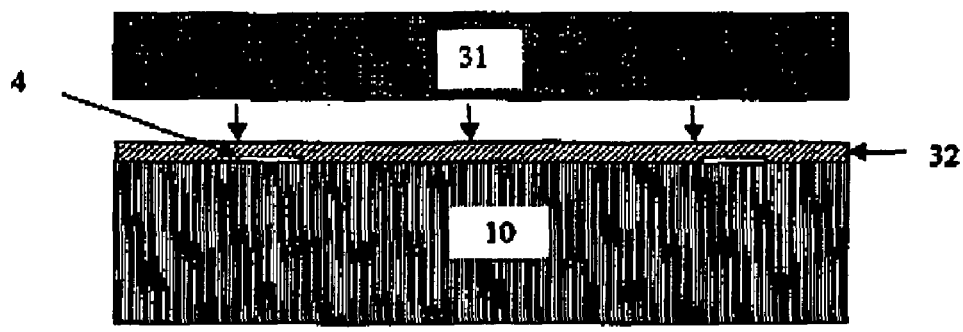
FIGS. 5a to 5h depict cross sectional views, showing a particular portion of a microstructure during specific phases of the fabrication process for the vacuum cavity of FIGS. 2a and 2b.
Figure 5B:
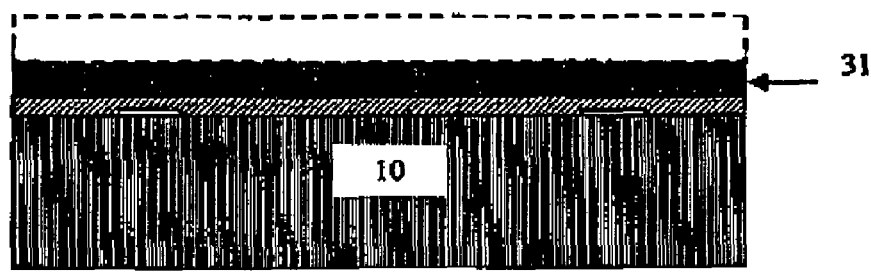

FIG. 5a is cross sectional view of substrate wafer 10 comprising electrical components such as readout IC 16 and metal contacts 4; a cap wafer 31; coating the substrate wafer 10 and/or the cap wafer 31 with an epoxy layer 32, which may be adhesive, photoresist, BCB, and/or polyimide, bringing them to face each other, and bonding them under pressure and vacuum in a bladder press. The cap wafer is preferably a silicon wafer, which needless to say may comprise metal layers and other electrical components depose on bonded side. Alternately, the epoxy layer can be coated on the cap wafer 31 instead of the substrate wafer 10, or both. The preferred method of epoxy coating is spin casted like photoresist coating process used in IC wafer processing. The thickness is controlled by the viscosity and spin speed. The preferred method of spin casting is dispense the liquid epoxy at center of the wafer, then turn on the spinner at the desired spin speed for less than 2 seconds without going through multiple spin speed cycles. FIG. 5b is cross sectional view of composite wafer of substrate wafer 10 and cap wafer 31 after bonding, wherein the cap wafer 31 is thinned by grinding and polishing to a desirable thickness.

Figure 5C:
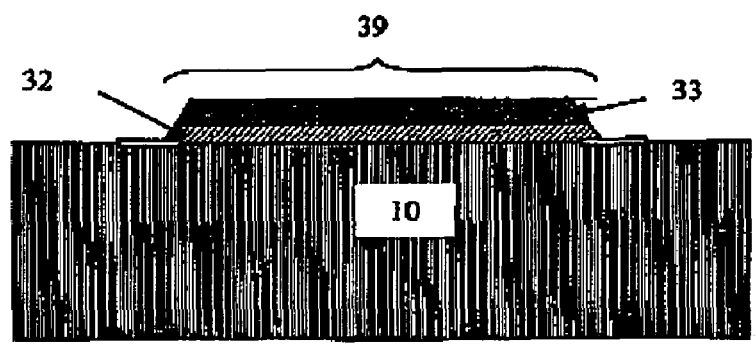

FIG. 5c is cross sectional view of the composite wafer after the thinned cap wafer 31 is patterned with photoresist and etched into a plurality of individual islands 39 of silicon cap 33 and epoxy 32 layers. A slight slope in the edge profile of the island 39 is preferred. The cap etch and the epoxy etch can be done in the same or in separate plasma etchers using a two step process, one for etching silicon, one for etching the underlying epoxy. In order to have good coverage on the sidewall, the epoxy etch should be without undercut. One approach is to use high density plasma (HDP) systems, such as ICP (inductively coupled plasma), ECR (electron cyclotron resonance), MERIE (magnetic enhanced reactive ion etching) where very low pressure can be employed for the reactive ions to attain higher energy and directionality. The preferred gas is one that contains hydrogen and/or argon, in addition to other gaseous constituents. This plasma chemistry etches silicon and epoxy at close to the same rate, which is preferable. Additionally, the hydrogen etches photoresist slightly, which causes the pattern to pull back and results in slight slope on the sidewall. This creates the preferred sloped sidewall profile.

Figure 5D:
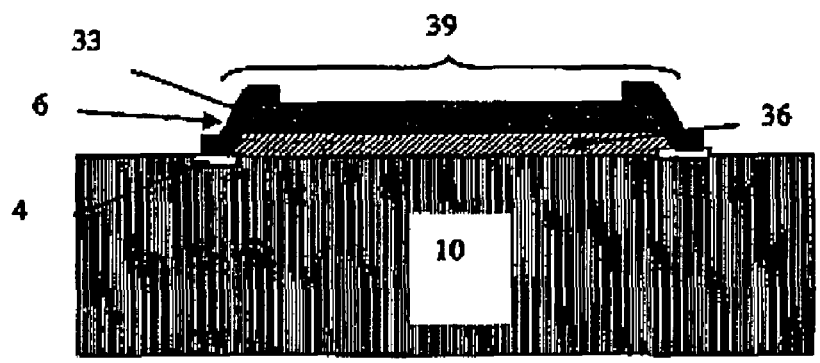

FIG. 5d is cross sectional view of the composite wafer after deposition of metal layer(s) by sputtering or evaporation that covers the sides of the islands, pattern and etch to form sidewall 6 on the sidewall of island 39. The metal pattern may cover the rim of the silicon island to maximize contact area. The metal layer(s) can be used as seed layer for electroplating of very thick metal layer(s) 6 on the sides of the islands 29, after patterning. The metal sidewall 6 is in contact with contact 4 to provide electrical connection to the readout IC on substrate 10.

Figure 5E:
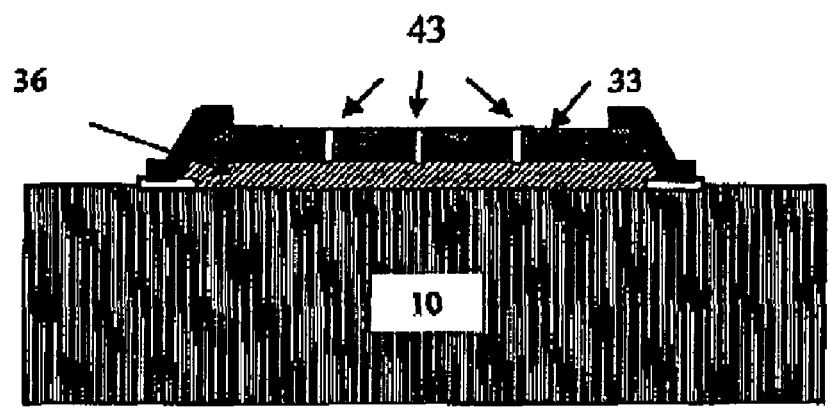

FIG. 5e is cross sectional view of the thinned composite wafer after patterning and etching etch access holes 40 in cap 33, wherein epoxy 36 is exposed through the etch access holes 40. The etch access holes are kept as small as possible, on the order of 2 μm.

Figure 5F:
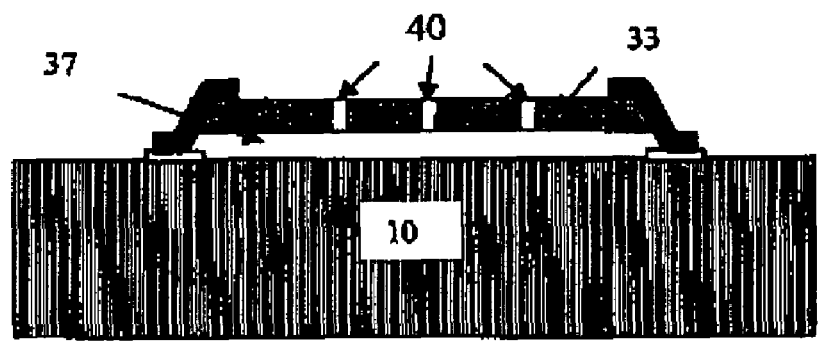

FIG. 5f is a cross sectional view of the thinned composite wafer after the epoxy 36 is etched away through the etch access holes 40 using oxygen-containing gas in a plasma etcher, leaving a cavity 37.

Figure 5G:
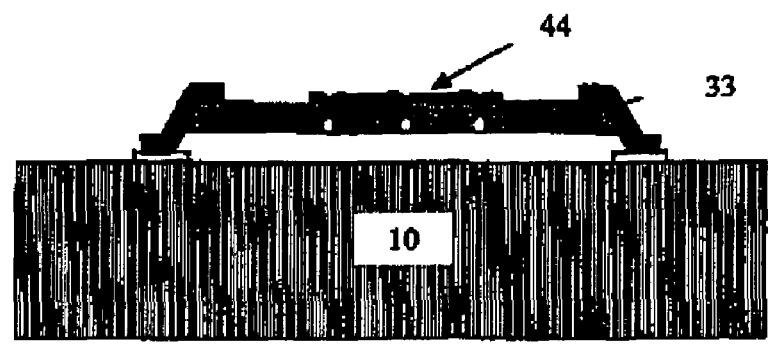
Figure 5H:

FIG. 5g is cross sectional view of cavity 37 on substrate wafer 10 after the etch access holes 40 are sealed with patterned and deposited films 44, which can be deposited by the following deposition techniques: (1) vacuum evaporation while the substrate is tilted and being rotated, (2) plasma-enhanced chemical-vapor deposition, and (3) sputtering. During deposition, the films 44 accumulates at the openings 43 of the etch access holes 40 and eventually closes the openings 43, as shown in FIG. 5h. This is done under vacuum or under inert atmosphere, which renders the cavity 37 a vacuum, or hermetic packaging; a vacuum packaging if sealing is done under vacuum; a hermetic packaging if sealed under inert atmosphere. The thin films used for sealing the cavities include metals and dielectrics. The following metals may be used: Ti, Zr, Al, Ta, Sn, Pb, W, Si, Au, Ni, Ge, Cr, Fe, V, C, and Th. Many of them can serve as gas gettering materials, which react of absorb gases such as oxygen, nitrogen, hydrogen, hydrocarbons, $CO_2$ and moisture. They can be deposited in the cavities or on a sidewall of the etch access holes during the sealing process by evaporation or sputtering, to pre-access vacuum in the cavities from degrading. The dielectrics films used for sealing include PECVD (plasma enhance chemical vapor deposition) $SiO_2$ and $Si_3N_4$ films. Alternately, getter metals can be deposited on the underside of the cap wafer 31 before bonding to the substrate wafer 10 and activated by heat after the vacuum cavities are sealed. Such getters include $TiN_xO_y$, and Ti—Zr alloys and are disclosed in parent patent application Ser. No. 10/213,564, filed Aug. 7, 2002 and entitled "A Microelectromechanical Device made from Mono-crytalline silicon and method of manufacture therefore".

$TiN_x$ films, when prepared by sputtering or evaporation, have resistivity that is dependent on the deposition condition. Upon exposure to air, their resistivity showed a large rate of increase, which tapered off with time. This was attributed to conversion of the $TiN_x$ films to $TiO_xN_y$, where the x-value increases with time to form higher oxides such as $TiO_x$, TiO, $Ti_2O_3$, in and/or $TiO_xN_y$, as dictated by the Ti—N—O ternary phase diagram, by reacting with oxygen in the air or moisture in the deposition chamber through grain boundary diffusion. (C. F. Wan, et. al. J. Vac. Sci. Technol. B 10(4), 1992). This suggests that such thin film can getter gas at room temperature and continue to do so, albeit slowly. Thus this thin film can be deposited on the cap or sidewall inside the packaging before being sealed for use as getter. It can also be deposited in the etch access hole before being sealed. Furthermore, it can be regenerated by low temperature activation (~100° C.) after usage for increased rate of gettering. Such a low activation temperature is unprecedented and has profound implications.

Referring to FIG. 3a and FIG. 3b, vacuum cavity 37 formed by the method described in FIG. 5a to FIG. 5g constitute a capacitive pressure transducer when the caps 14 is conductive and forms a flexible diaphragm which pairs with electrode 5 on the substrate 10 to form a sense capacitor whose capacitance varies with deflection of the diaphragm 14 in response to external pressure. A readout microcircuit (ROIC) 16 on the substrate 10 converts the capacitance variations into electrical signal. Also shown in FIGS. 3a and 3b are bosses 1, which may be formed in the center of each diaphragm for improved sensor performance, by controlled thinning to form a 100 to 300 μm wide, ~3 μm thin ring 2 in diaphragm 14 (in FIG. 3b). For increased sensitivity and linearity, thickness of boss 1 is preferably 10 times larger than the thickness of ring 2. Operating range of the pressure sensor is determined by the thickness and width of ring, which determine flexibility of the diaphragm and thus its response to pressure. Cavities 11 and 13 have rings 2 of different widths, thus they cover two different ranges of pressure. Cavity 12 has no thin ring, whose diaphragm is inflexible, and is used as reference.

Referring to FIG. 4a and FIG. 4b. The vacuum cavities can form piezoresistive pressure transducers when their caps are flexible diaphragms the cap wafer comprises piezoresistors 22 that are prefabricated on the front surface prior to epoxy wafer bonding. The piezoresistors sense resistance changes due to changes in strain in silicon p+ resistors that are embedded in the diaphragms. Bosses are not required for these pressure transducers. Metal lines 23 are also fabricated on the cap wafer. They are used for transmitting electrical signals from the piezoresistors to the contacts 4 of the readout IC on the substrate 10 via metal posts 6. Metal lines 23 must be electrically isolated from one another. This entails use of insulator 34 to form at least part of the sidewall to isolate metal posts 6 from one another.

In pressure sensor embodiments of FIGS. 3 and 4, thickness of diaphragms 14 or rings 3 must be controlled accurately, which can be achieved by timed etch or by instituting etch stops, such as the insulator oxide in an SOI (silicon on insulator) wafer and heavily doped p-type layer. The latter can be formed by boron diffusion prior to bonding and acts as etch stop for EDP (ethylenediamene pyrocatecol) silicon etch, and electrochemical etch-stop (ECE) technique. In general, a timed etch is controlled by etch time, temperature, and etchant (KOH, potassium hydroxide) concentration. The etching process is terminated when the wafer is removed from the etch tank. The timed etch process is easy to implement and does not require additional semiconductor processing or special design modifications. It does, however, produce large thickness variations for diaphragms across a wafer and from one wafer to another. In its favor, the ECE technique allows tighter control of the diaphragm thickness and more predictable distribution, which results in a narrower range of device parameters to be calibrated. The ECE etch-stop technique uses a p-type substrate with an n-epi layer, tightly specified for thickness and resistivity. During etching, the wafer is immersed in the KOH bath, and a controlled bias is applied between the n-epi layer of the wafer and the etch bath, making the p-n junction act as a reverse-biased diode. In the reverse-biased mode, the diode prevents the etchant from being exposed to any current, and the KOH performs a normal anisotropic etch through the substrate until it reaches the junction. Then, because the diode has been etched away, the KOH is exposed to the applied bias, and a reaction forms a thin layer of silicon dioxide that stops further etching. The diaphragm thickness is therefore unaffected by typical variations that affect the timed etch; instead, it is necessary only to ensure that the wafer is supplied with the correct n-epi thickness, junction bias voltage, and bath temperature. Another etch stop is silicon oxide or nitride dielectric insulator layers, which can be grown or deposited on silicon prior to deposition of a layer of polysilicon or epitaxial silicon as the diaphragm. Additionally silicon-on-insulator (SOI) material may be used, where the insulator act as the etch stop.

Figure 6A:
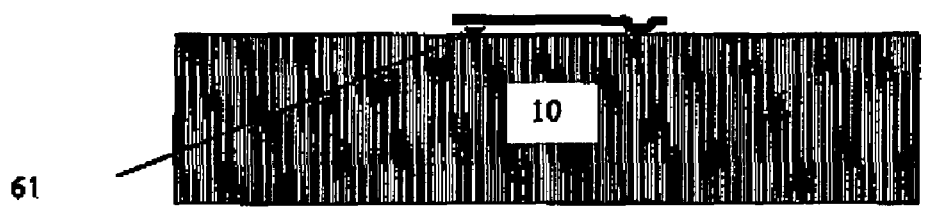
Figure 6B:
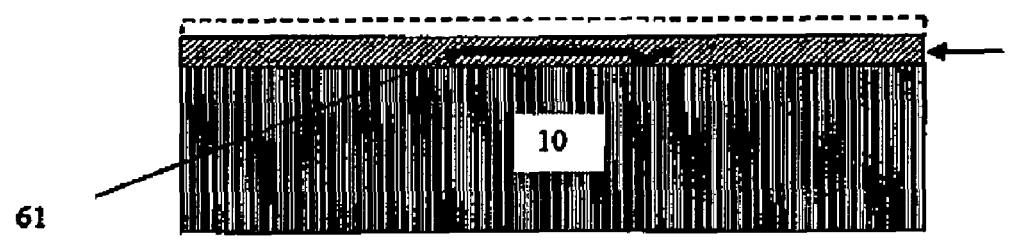

The cavity made by the method described above can be used to package MEMS devices, at the wafer level, in vacuum or in inert gas. This is applicable to most MEMS devices, preferably those fabricated by surface micromachining techniques that employ sacrificial layers to make suspended microstructures. They include such micromachined devices as micro bolometers, thin-film infrared detectors, tilting mirrors, accelerometers, gyroscopes, RF (radio frequency) MEMS switches and resonators. The advantages are (1) wafer-level packaging, where all the devices on a wafer are packaged at the wafer level, (2) semiconductor IC fabrication techniques, and (3) the sacrificial layer is removed right before sealing thus avoids unnecessary exposure to the environment. Furthermore, the MEMS device and its packaging can be fabricated in one process sequence. A preferred embodiment of the process steps, in packaging MEMS devices on wafer level using epoxy-bonded wafer as cap, is described herein. FIG. 6a shows a substrate wafer 10 containing the cantilever MEMS devices 61 to be packaged. The embodiment is to bond a wafer as cap with epoxy onto the substrate wafer 10. The bonding requires that the bonding surfaces to be smooth to avoid voids in the bondline. In prior art, wafer planarization is normally done by deposition of sacrificial planarization layer such as $SiO_2$ on the substrate and using chemical-mechanical polishing (CMP) to smooth the surface. However, this technique is tedious and is not suitable for substrate wafers that have large topologies or suspended structures. In the present embodiment, an epoxy substitutes for $SiO_2$ as the sacrificial planarization layer. A step-by-step description follows below:

Step 1: Referring to FIG. 6b, epoxy 60 is applied on substrate wafer 10 as a liquid by pouring, potting, spinning, spraying, screen printing or inkjet printing, to fill the space under the cantilever 61 and create a thick, smooth coating of a few mils thick. The epoxy 60 layer is cured by heat or UV radiation, and subsequently planarized by grinding and polishing (FIG. 6b).

Figure 6C:
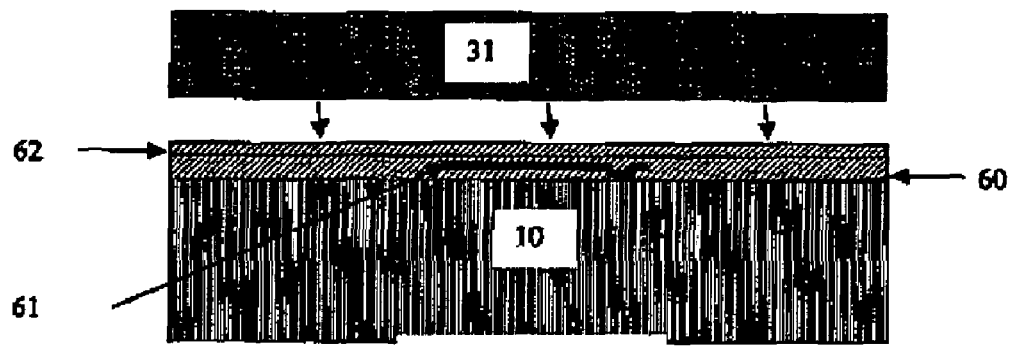

Step 2: Referring to FIG. 6c, coating the epoxy-planarized substrate wafer 10 and/or a cap wafer 31 with an epoxy layer 62, bringing the two substrate wafers 10 and the cap wafer 31 to face each other (FIG. 6c), and bonding them under pressure and vacuum. The cap wafer 31 is preferably high-resisitivity silicon having a conductive metal layer 33 coated on the underside.

Figure 6D:
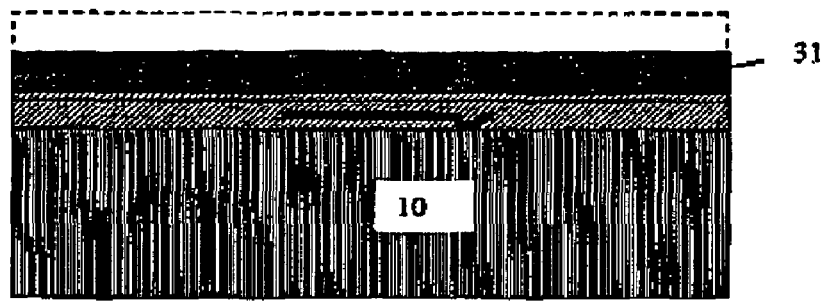

Step 3: Referring to cross sectional view in FIG. 6d, composite wafer of substrate wafer 10 and wafer 31 after bonding; top side of the wafer 31 is thinned to a membrane by grinding and polishing.

Figure 6E:
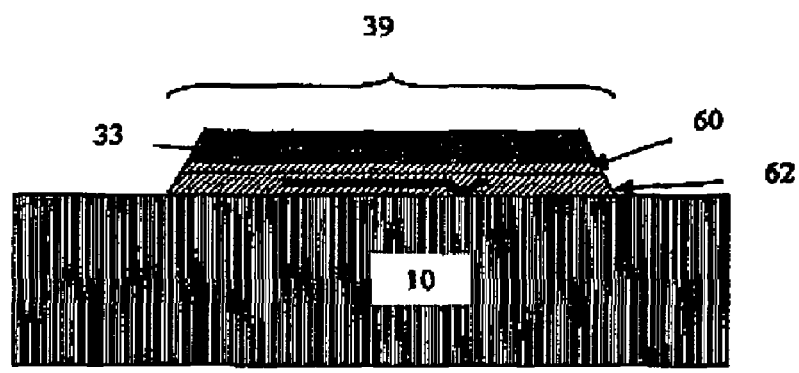

Step 4: Pattern and etch the thinned cap wafer 31, epoxy 60 and sacrificial layer 62 to form islands 39 having caps 33 (FIG. 6e).

Figure 6F:
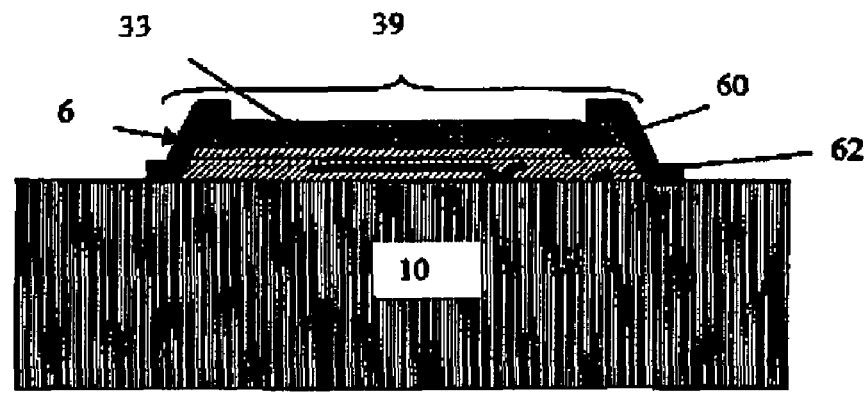

Step 5: Deposit by sputtering of metal layer(s) to cover etched sides of islands 39, providing a seed layer for subsequent electroplating of thicker metal layer(s) to form patterned metal sidewall 6 on the sides of the islands 39 (FIG. 6f).

Figure 6G:
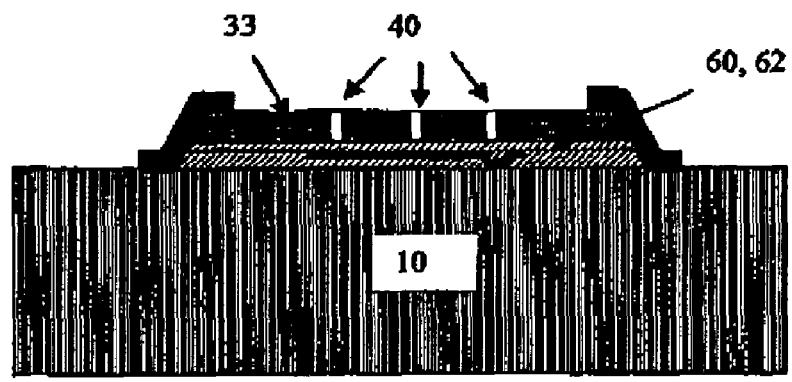

Step 6: Pattern and etch a plurality of etch access holes 40 on cap 33 (referring to FIG. 6g) with a spacing of about 30 to 200 µm and diameter of 2 to 5 µm.

Figure 6H:

Step 7: Etch remove the epoxy 60 and the sacrificial layer 62, through the etch access holes (FIG. 6h) in a dry etcher with appropriate plasma chemistries to form empty cavity 36.

Step 8: Deposit metal and/or dielectric films to seal the etch access holes 40 using deposition techniques that enhanced step coverage (referring to FIG. 6i). They include (a) vacuum evaporation with substrate at a large tilt angle and rotation, (b) plasma enhanced chemical vapor deposition, and (c) sputtering. They are done under a vacuum so that the cavities 36 are sealed vacuum cavities or hermetic cavities.

When the vacuum packaging became large, its cap may experience excessive cave-in in the center due to the atmospheric pressure. This can be avoided by increasing thickness of the cap or by adding support posts in the middle. The support posts can be made by adding holes in the patterning of the islands at Step 4. Referring to FIG. 7a (cross sectional view) and FIG. 7b (top view), the metal deposition at Step 5 form support posts 58 in the middle of the cap 14 of the vacuum package.

Figure 8A:
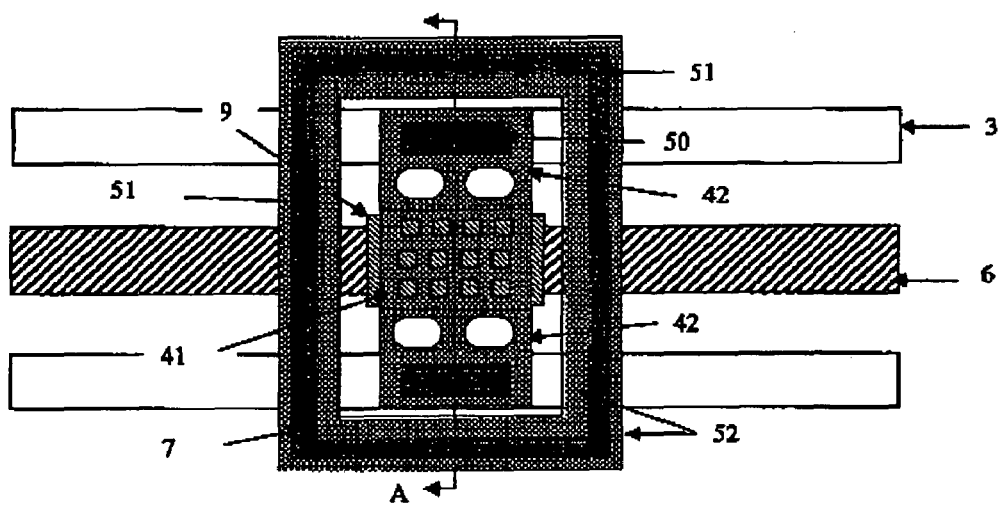
FIG. 8a is a top view of a micro switch capable of being made by the system and method of the present invention.
Figure 8B:
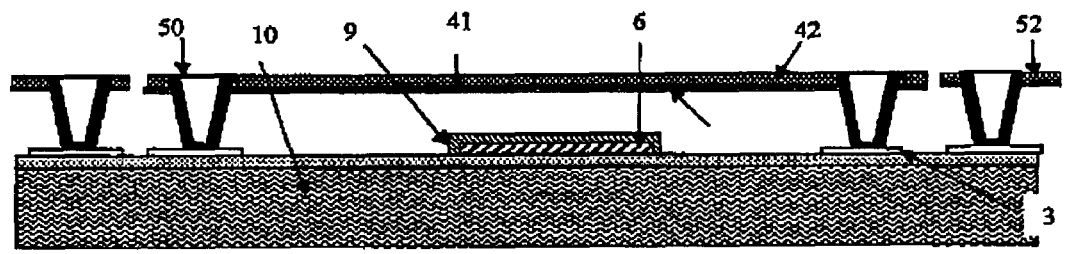
FIG. 8b is a cross sectional view of a micro switch embodiment in its OFF state that is capable of being made by the system and method of the present invention.
Figure 8C:
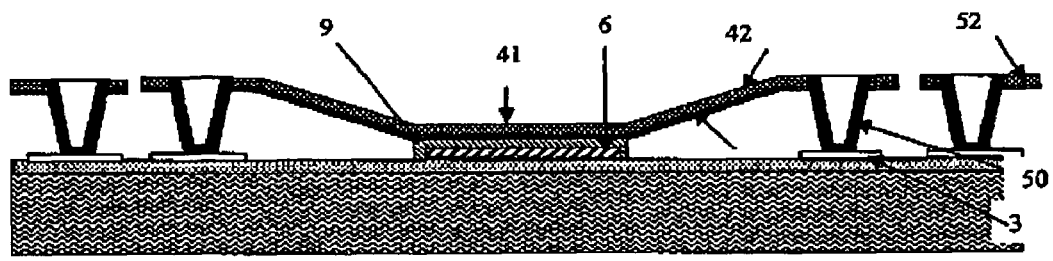
FIG. 8c is a cross sectional view of a micro switch embodiment in its ON state that is capable of being made by the system and method of the present invention.

The exemplary MEMS devices employed in the vacuum packaging method embodiment in FIGS. 6a to 6i are cantilever or bridges. The preferred method of manufacturing such MEMS devices is by micromachining epoxy-bonded silicon materials. The preferred embodiment of the process sequence in making and packaging an MEMS RF switch is described in Steps 1a through 12a below. Steps 1a through 6a are for fabricating the RF switch, and subsequent Steps 7a through 12a are for packaging the RF switch. Top view of the RF switch is shown in FIG. 8a. It comprises a flexible, suspended main electrode 41 and a fixed signal electrode 6 on the substrate. The suspended main electrode 41 is suspended by a pair of springs 42 that are anchored and supported by a pair of metal posts 50, which interconnect the suspended main electrode 41 and springs 42 with metal pads 3 and any circuits on the substrate. Cross-sectional views of the RF switch are shown in 8b and 8c. FIG. 8b depicts the suspended main electrode 41 of the RF switch in the UP or OFF position. FIG. 8c depicts the suspended main electrode 41 is been pulled down and held in the DOWN or ON position by a DC bias voltage being applied on the signal electrode 6, while the suspended main electrode 41 (via grounded line 3) is grounded. In the DOWN or OFF position, the capacitance between the suspended main electrode 41 and the fixed signal electrode 6 is large due to small thickness (~2000 Å) of the insulator 9, the impedance for transmission of high frequency alternating current (AC) between the two electrodes becomes negligibly small. Thus the suspended main electrode 41 is AC-coupled to the fixed signal electrode 6. Membranes 42, which act as springs, and suspended main electrode 41 in FIG. 8a are made of high resistivity single-crystal silicon coated with a highly conductive metal film on the underside surface, instead just deposited metal film. Due to the fact that the silicon membrane is more rigid and thicker than the metal films membrane, the membrane 42 may have cutouts in springs 42 for reducing the stiffness in the springs 42.

Figure 9A:
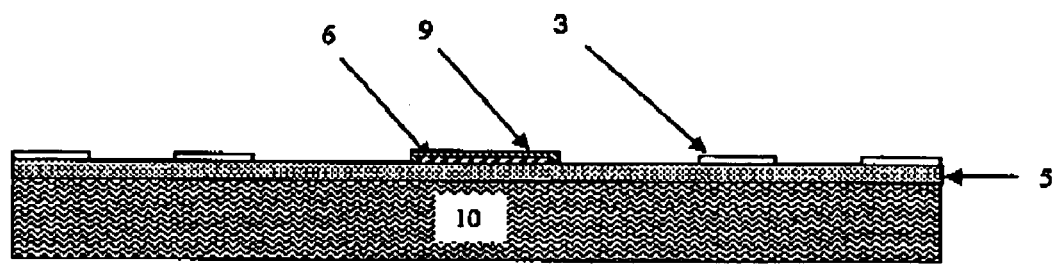
FIGS. 9a to 9n respectively depict cross sectional views, showing a particular portion of a microstructure during specific phases of the fabrication process for a micro switch and its packaging.
Figure 9B:
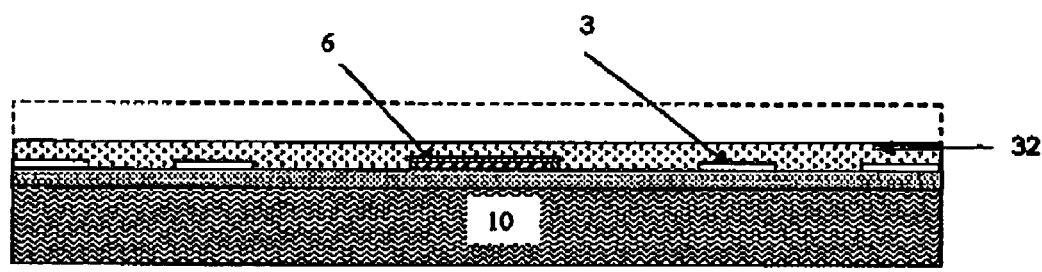

Step 1a: Referring to FIG. 9a, which is cross sectional view of substrate wafer 10 comprising RF control circuitry such as the fixed signal electrode 6, grounded electrodes 3, insulator 9, grounded plane, and integrated circuits. The substrate wafer 10 is planarized with a thick epoxy layer 32 using the method described in Steps 1 to 3 above.

Figure 9C:
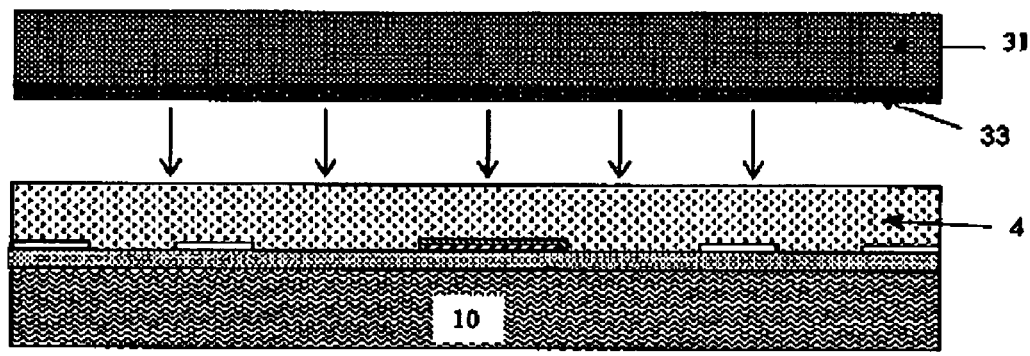

Step 2a: Coat one or both of the planarized substrate wafer 10 and silicon wafer 31 with an uncured epoxy layer 4, bringing the substrate wafer 10 and the silicon wafer 31 to face each other (FIG. 9c) for bonding. The wafer 31 is preferably high-resisitivity silicon having a conductive metal layer 33 coated on the underside.

Figure 9D:
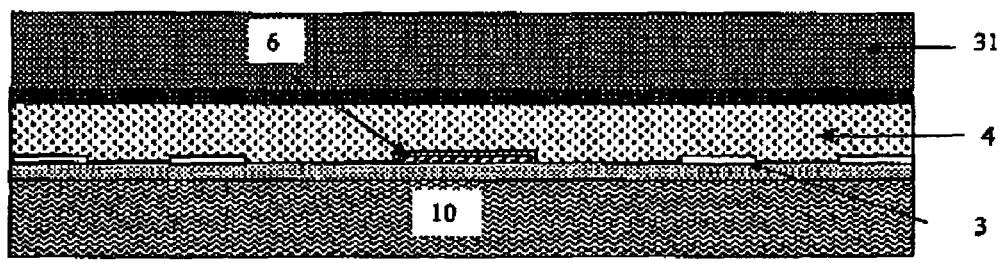
Figure 9E:
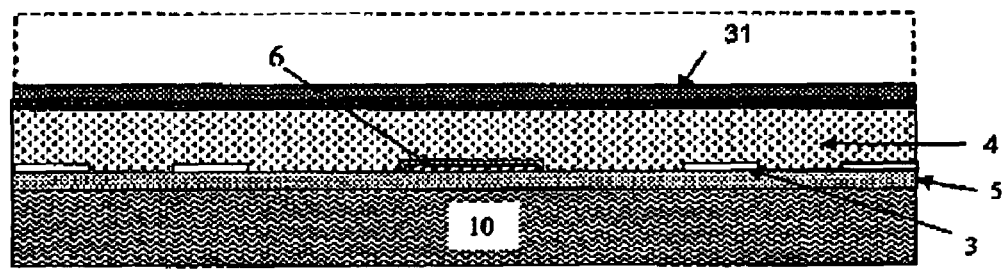

Step 3a: Bond the wafers 10 and 31 together under pressure and vacuum (FIG. 9d), thin the wafer 31 a membrane by grinding and polishing (FIG. 9e).

Figure 9F:
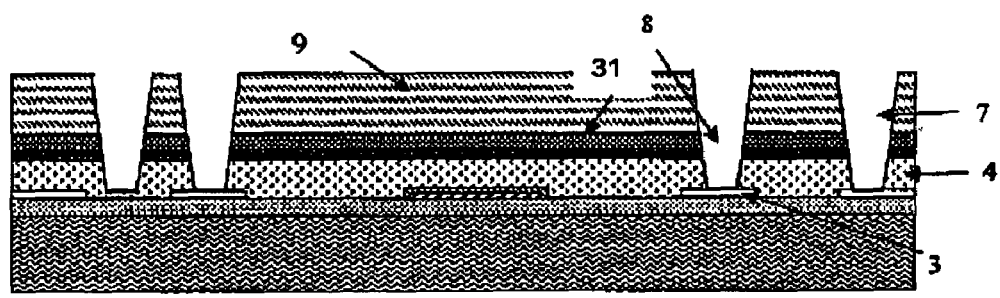

Step 4a: Referring to cross sectional view of FIG. 9f. Via holes 8 and a surround via 7, which encompass the intended RF switches, are patterned with photoresist 9 and etched in the membrane 31 and epoxy layer 4.

Figure 9G:
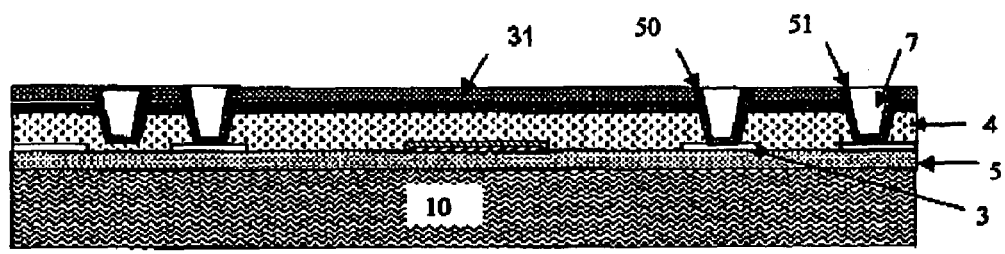

Step 5a: Deposit thick metal layer(s) by sputtering, evaporation, and/or electroplating covering sidewalls of the via holes 8 and the surround via 7, to form posts 50 and 51 (FIG. 9g). Photoresist 9 is removed with solvents, thus extraneous metals are also lifted off. The metal posts 50 are in contact with electrodes 3 to provide electrical interconnection to the readout IC on substrate 10.

Figure 9H:
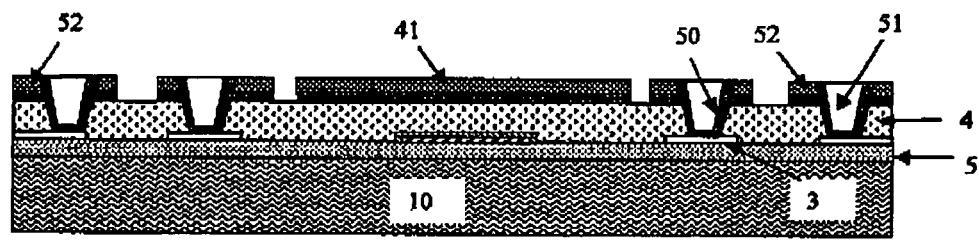

Step 6a: Pattern and etch membrane 31, metal posts 50 and 51, and substrate 10 to form bridge 41 and surround deck 52 around metal posts 51 to form intended RF switches, exposing the underlying epoxy layer 4, as shown in FIG. 9h. Top view of the RF switch at this stage of fabrication can be seen in FIG. 8a.

Figure 9I:
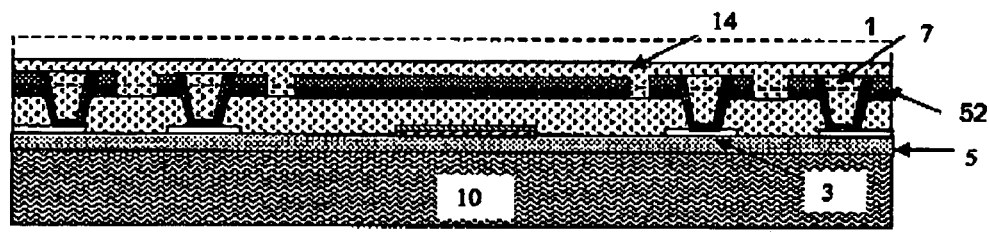

Step 7a: Planarize the wafer with epoxy again. FIG. 9i is cross sectional view of the RF switch in FIG. 9h, after coating with a thick layer of epoxy 14 on the surface and thinned by grinding and/or polishing to create a thick, smooth, planar membrane 20.

Figure 9J:
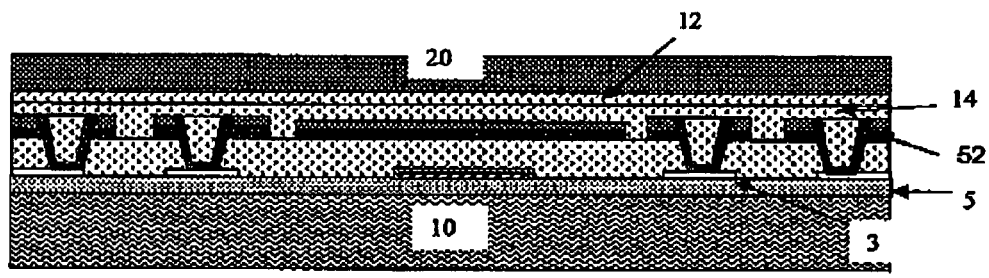

Step 8a: Coat the wafer with yet another layer of epoxy 12 and bonding a cap wafer 20 on top, which is subsequently thinned to the desired thickness by grinding and/or polishing again. FIG. 9j is cross sectional view of the wafer after this process step.

Figure 9K:
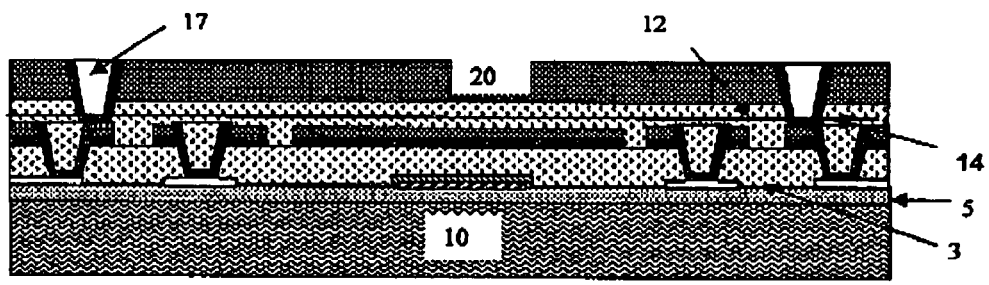

Step 9a: Upper surround vias 17, which encompass the intended RF switches on the wafer, is patterned with photoresist and etched in the cap wafer 20 and the underlying epoxy layers 12 and 14, down to the surround deck 52, deposition of metal layer(s) by sputtering, evaporation, and/or electroplating covering sidewall of the upper surround via 17. FIG. 9k is cross sectional view of the wafer after this stage of fabrication.

Figure 9L:
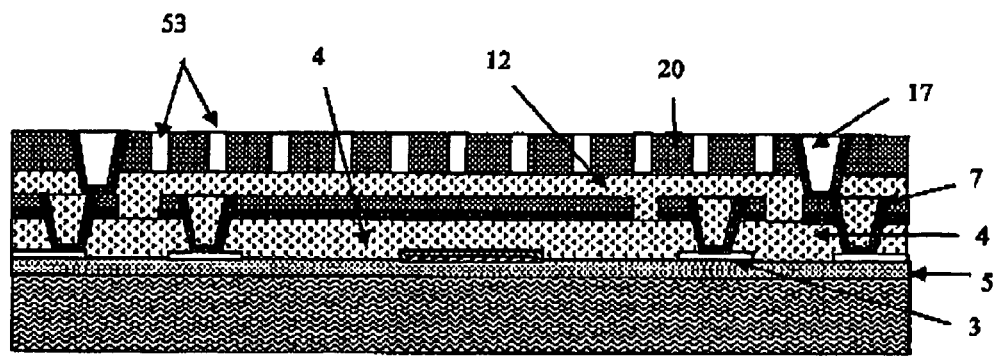

Step 10a: Pattern and etch a plurality of etch access holes 53 in cap wafer 20, to the underlying epoxy 12. FIG. 9l is cross sectional view of the RF switch and the cap wafer 20 after the etching and removal of the photoresist pattern.

Figure 9M:
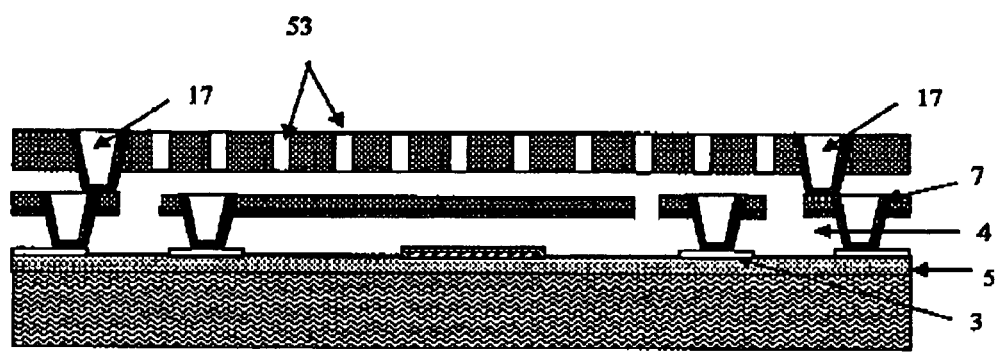

Step 11a: Etch remove all the epoxy layers including 4, and 14 through the etch access holes 53 using oxygen-containing plasma from under the cap wafer 20. This completes the fabrication of suspended electrodes of the RF switch. FIG. 9m is a cross sectional view of the wafer at this stage of manufacturing.

Figure 9N:
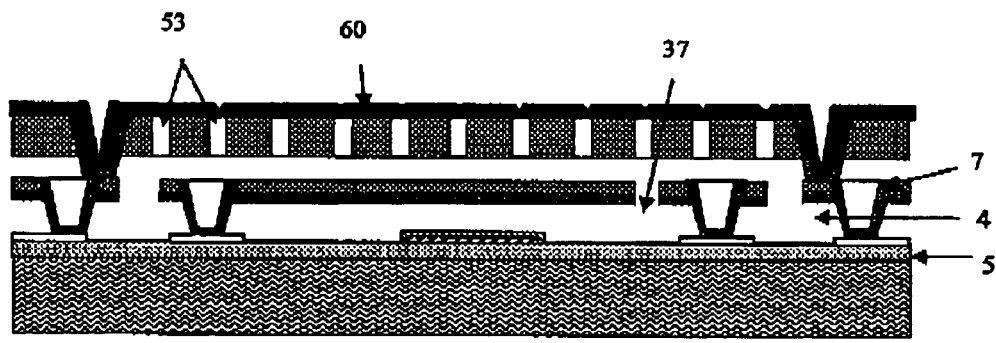

Step 12a: Pattern and deposit metal and/or dielectric layer (s) 60 to seal the etch access holes 53 and enclose the cavity 37 and the RF switch under a vacuum or an inert atmosphere. These deposited sealing layers may comprise getters and/or high conductivity metals. FIG. 9n is a cross sectional view of the RF switch and the cap wafer 20 after after vacuum packaging.

Figure 10:
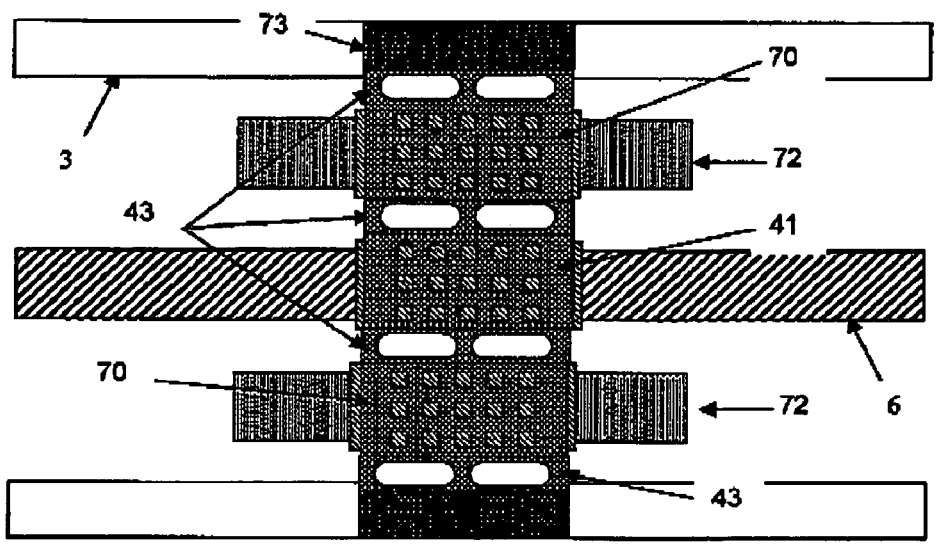
FIG. 10a is a cross sectional view of a micro switch embodiment having two side electrostatic actuators in its OFF state that is capable of being made by the system and method of the present invention.
FIG. 10b is a cross sectional view of the micro switch embodiment of FIG. 10a in its intermediate state.
FIG. 10c is a cross sectional view of a micro switch embodiment of FIG. 10a in its ON state.
FIG. 10d is a cross sectional view of a contact micro switch embodiment in its ON state that is capable of being made by the system and method of the present invention.
Figure 11A:
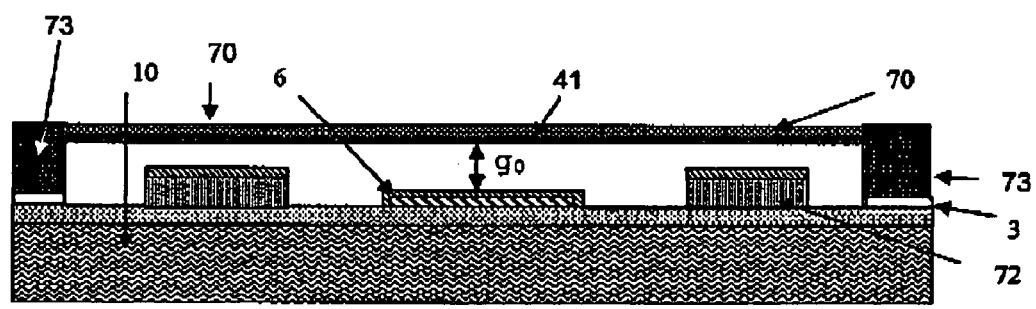
FIG. 11 is a top view of a micro cavity embodiment having a support post in the middle capable of being made by the system and method of the present invention.
Figure 11B:
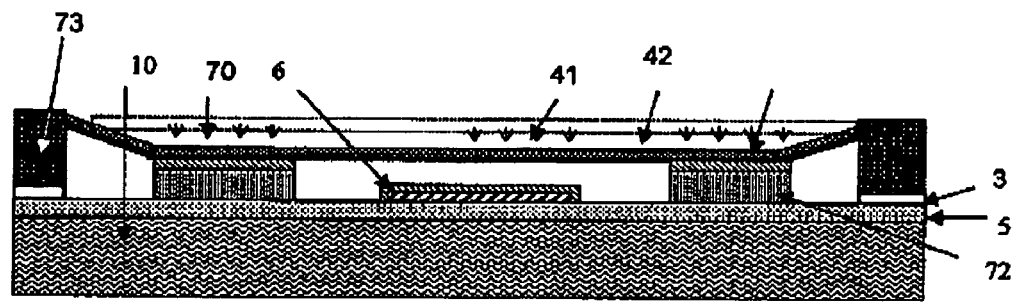
Figure 11C:
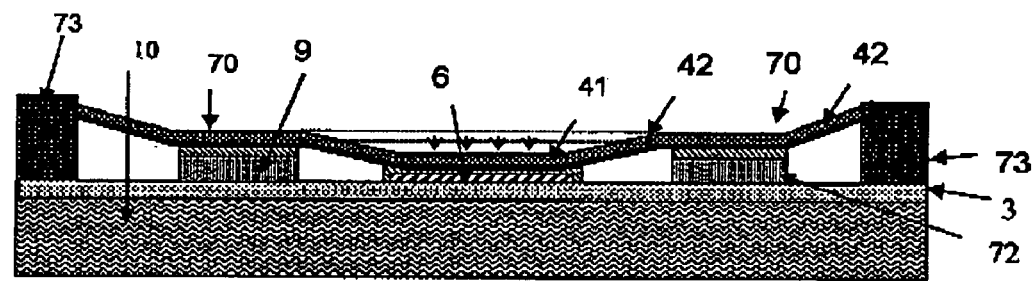

To minimize insertion loss of the RF switch, the ON state capacitance should be large while the OFF state capacitance should be small. This entails that the spacing or gap $g_o$ between these electrodes be large than 3 µm. The voltage required to pull the suspended electrode 41 down to the fixed electrode 6 by electrostatic force may exceed 30 volts, which has been seen to cause unwanted charging on insulator after prolonged use, and eventual failure of the switch. The minimum voltage required is called pull-in voltage, which is dependent on area of the electrode, spacing or gap $g_0$ between the suspended and fixed electrodes, and spring constant of the membrane or springs. Lowering the pull-in voltage without decreasing the gap $g_0$ without softening the spring is desirable, as the spring provides the restoring force and determined the switching speed. In prior art, a pair of side electrostatic actuators are implemented for lowering or rid of bias voltages. These additional electrostatic actuators are used to reduce or eliminate the bias voltage to be applied on the fixed signal electrode 6. FIG. 10 depicts top view of the present RF switch embodiment. In this embodiment, the fixed side electrode 72 of the side electrostatic actuators is elevated by half the gap $g_o$ above the fixed signal electrode 6, as shown in a cross sectional view in FIG. 11a. Thus due to the 50% smaller gap, the pull-in voltage required to pull the suspended side electrode 70 down to the fixed side electrode 72 is lowered to 35%, as the pull-in voltage changes with $gap^{3/2}$. Here we have assumed all the respective suspended electrodes 41 and 70, springs 43, and the respective fixed electrodes 6 and 72 have the same dimensions. FIG. 11b shows the position of the suspended side electrode 70 and the suspended main electrode 41 when the 35% voltage is applied on the fixed side electrodes 72. In this position, the gap between the suspended main electrode 41 and the fixed signal electrode 6 is only ½ $g_o$, thus the voltage to be applied on the signal line 6 is also reduced to 35% for pulling the suspended main electrode 41 in (FIG. 11c).

The RF switch in FIG. 11b has two-tiered electrostatic actuator configuration, which reduces the pull-in voltage significantly. Greater reduction in pull-in voltage can be achieved by implementing a stepping electrostatic actuator, whose cross sectional view is shown schematically in FIG. 12a. Each fixed side electrode comprises three electrodes 80, 81, and 82 stacked on substrate 10 and form a stair with steps having height of ~¼ $g_o$ per step, where $g_o$ is the gap between the suspended membrane and the fixed signal electrode. The suspended side electrode comprises three separate suspended electrodes 90, 91, and 92, over fixed electrodes 80, 81, and 82, respectively. Electrodes 90, 91, 92 and 41 are connected side-by-side with springs 43, as shown in FIG. 12b. It is noted that there is an insulator 9 to keep the suspended electrodes from shorting to the fixed electrodes. Due to the fact that the gap between electrodes 80 and 90 is 75% smaller than that between electrodes 6 and 41, the pull-in voltage for electrode pair 80 and 90 is 87% smaller, if areas and spring constants are the same. When this occurs, the gap between electrodes 91 and 80 are shrunk to ¼ $g_o$. Thus its pull-in voltage is reduced close to 87%. This in turn shrinks the gap between electrodes 92 and 82 to ¼ $g_o$, giving rise to the same low pull-in voltage, which is 87% lower. Thus the net result is all the electrodes 90, 91, and 92 have pull-in voltages substantially lower than the pull-in voltage of an electrostatic actuator without the stepped fixed electrodes. In practice, it may be advantageous to implement various step heights, spring constant, and gap for optimized switching characteristics and design flexibility.

Figure 11D:
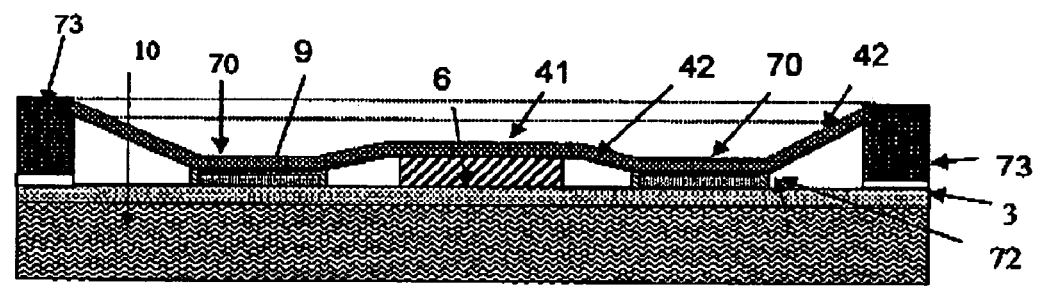

While the RF switch in FIG. 10 is depicted as a capacitive switch, it can also be configured as a contact switch similar to a relay switch when the insulator 9 on the fixed signal electrode 6 is absent. Thus a direct metal-to-metal electrical contact between the fixed signal electrode 6 and the suspended main electrode 41 can be made. Since bias cannot be applied on the fixed signal electrode 6 without causing extraneous current, the side electrostatic actuator(s) is used for operation. In this case the fixed side electrodes 72 must be no taller than the signal electrode to allow the suspended main electrode be pulled into contact with the fixed signal electrode 6, as shown schematically in FIG. 11d. While the RF switches described so far are for RF switching, they can be used as actuators for other device applications with slight modifications.

Figure 12A:
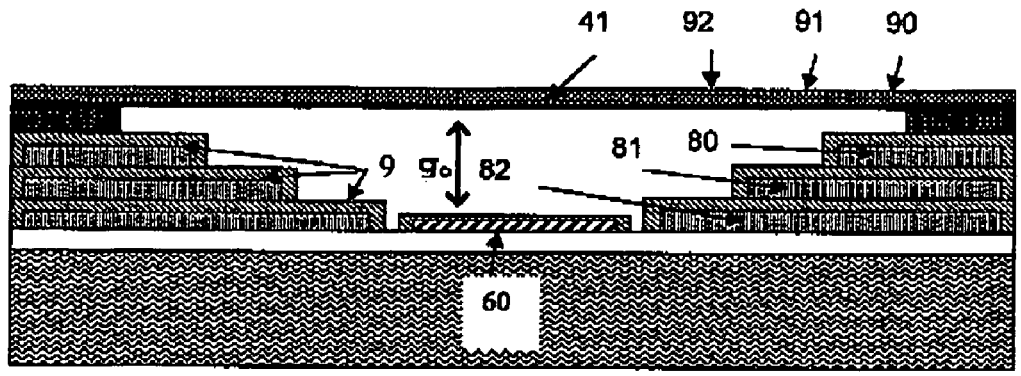
FIG. 12a is a cross sectional view of a stepping electrostatic actuator configured as a micro switch.
Figure 12B:
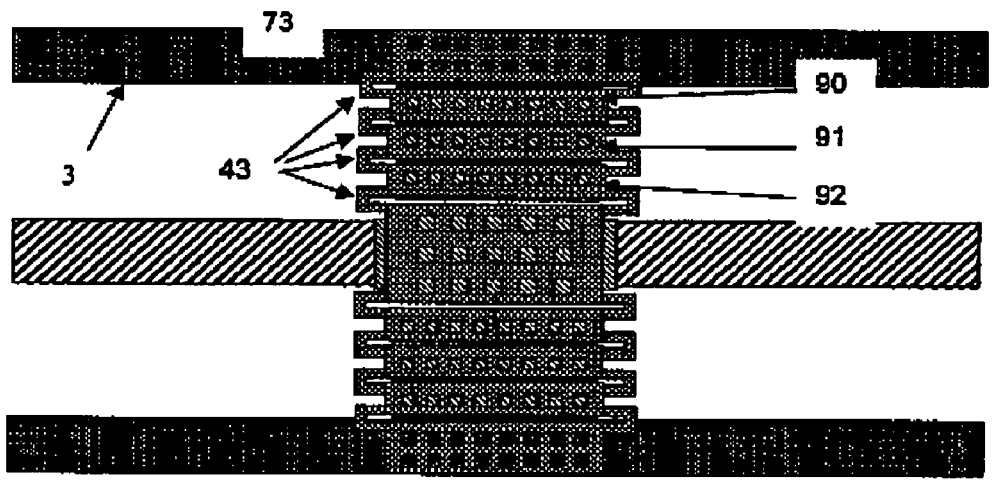
Figure 12C:
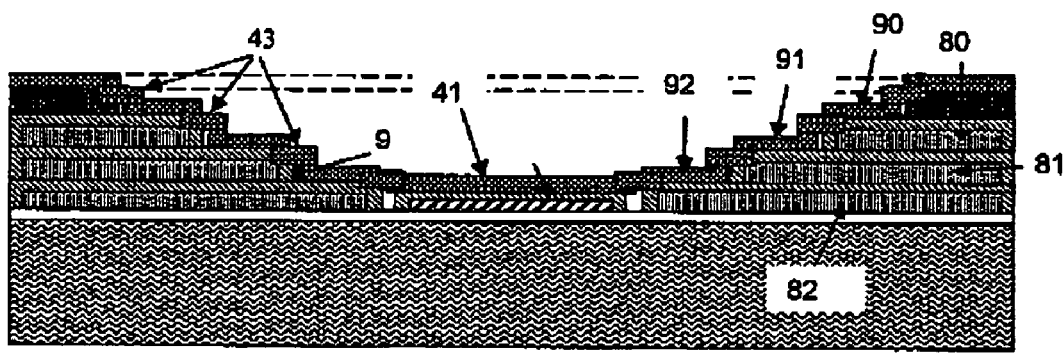
FIG. 12c is a cross sectional view of the stepping electrostatic actuator and micro switch embodiment of FIG. 12a in a fully switched state when all the suspended electrodes are pulled in, by applying appropriate voltages between the suspended electrodes and corresponding fixed electrodes.
Figure 13A:
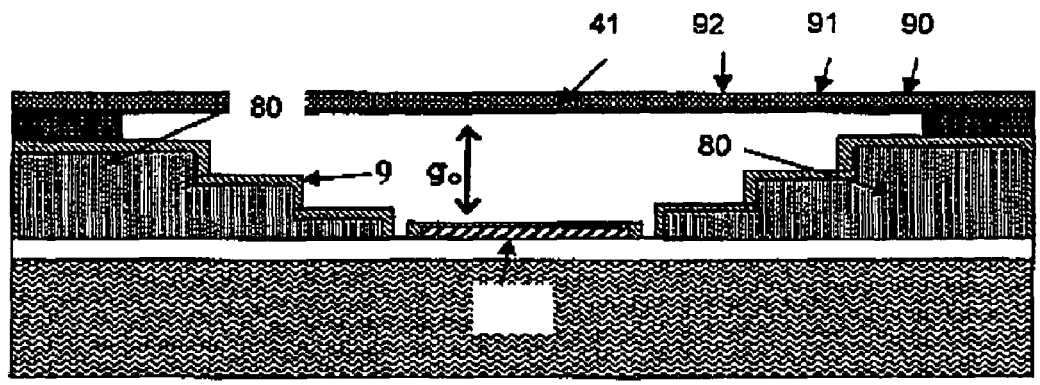
FIG. 13a is a cross sectional view of a stepping electrostatic actuator, being configured as a micro switch, and having stepped fixed electrodes.
Figure 13B:
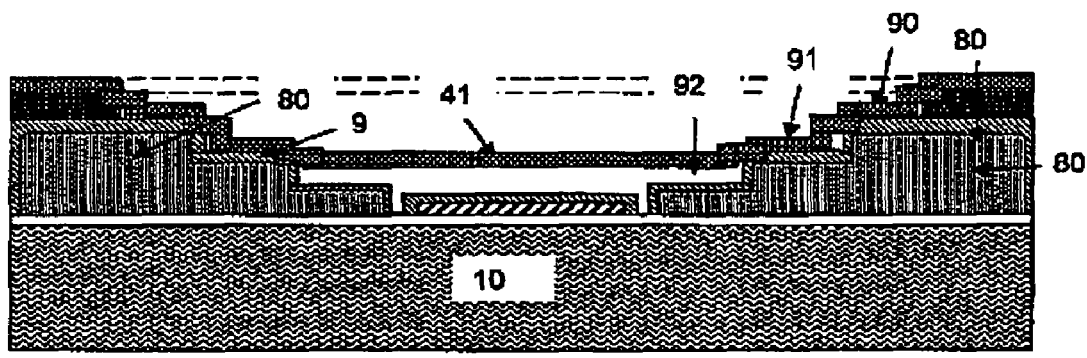

Each of the four steps in the RF switch in FIG. 12a corresponds to one of four positions the suspended main electrode 41 can assume. The actuation voltage for each position can be set by design of spring constants, electrode areas and gaps for each of the electrostatic actuators. The different electrode positions correspond to four different capacitance values that can be set with selection of the specific voltages. Thus the RF switch in FIG. 12a can be configured as a "digital" variable capacitor, or varactor, having four different capacitances, in addition to the zero-biasstate, depending on the electrodes being biased. In another preferred embodiment, shown as cross sectional view in FIG. 13a, the fixed side electrodes are combined, or electrically connected together to form a single electrode with steps. In this embodiment, the springs, electrode size and gaps for each of the electrodes 90, 91, and 92 are designed such that they are pulled-in in series when distinctly different voltages are applied on the stepped fixed electrode. As such, this MEMS electrostatic actuator embodiment is called stepping actuator. Referring to FIG. 13b, a proper bias is applied on the two stepped fixed electrode 80, while the suspended electrode 41 is at electric ground, to set the gap at the second step, where electrode 90 and 91 are pulled-in to the first and the second steps of the stepped fixed electrode 80. Needless to day, more than four steps can be instituted in the stepping actuator in FIG. 12a and FIG. 13a to yield more divisions in the gaps.

Figure 13C:
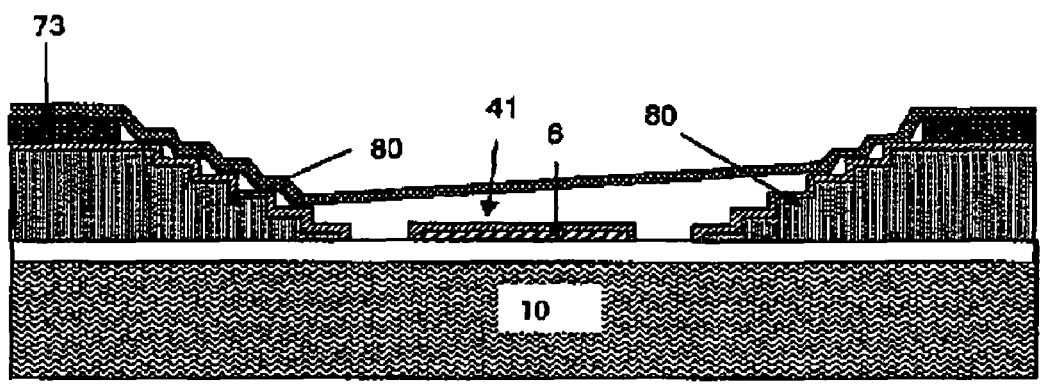
FIG. 13c is a cross sectional view of a stepping electrostatic actuator or micro switch in FIG. 13a, in an actuated state, where the main suspended electrode is tilted.
Figure 14A:
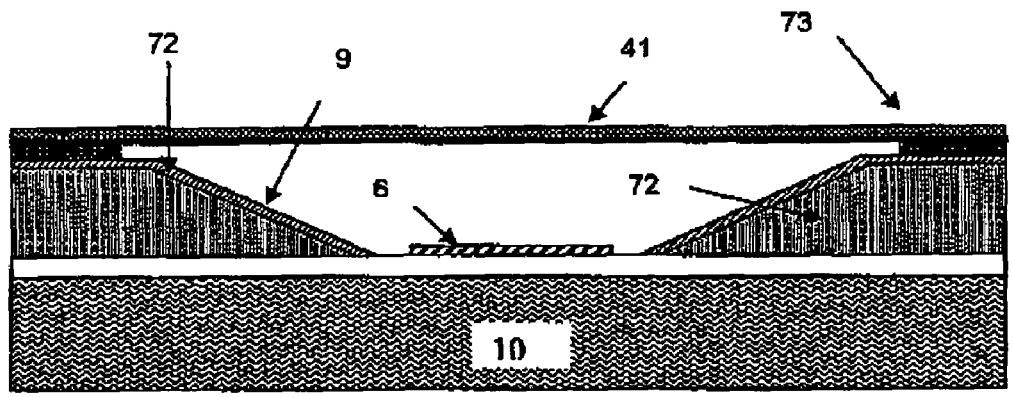
FIG. 14a is a cross sectional view of an analog electrostatic actuator having sloped fixed electrodes.
Figure 14B:
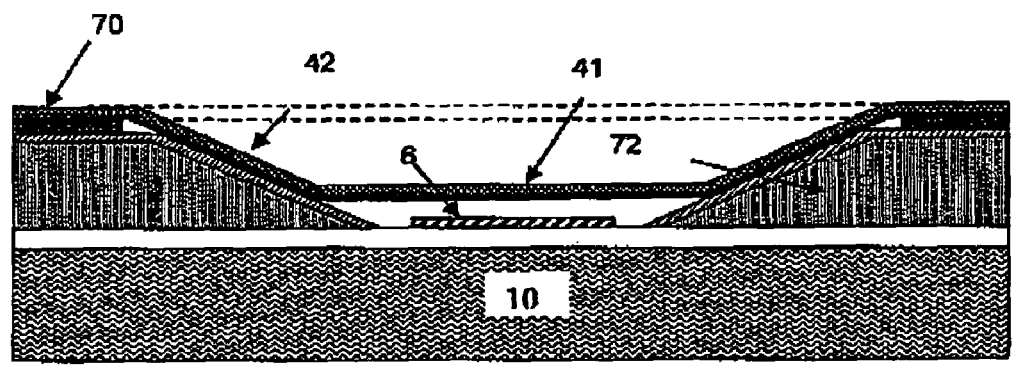
FIG. 14b is a cross sectional view of the analog electrostatic actuator in FIG. 14a in an actuated state.
Figure 14C:
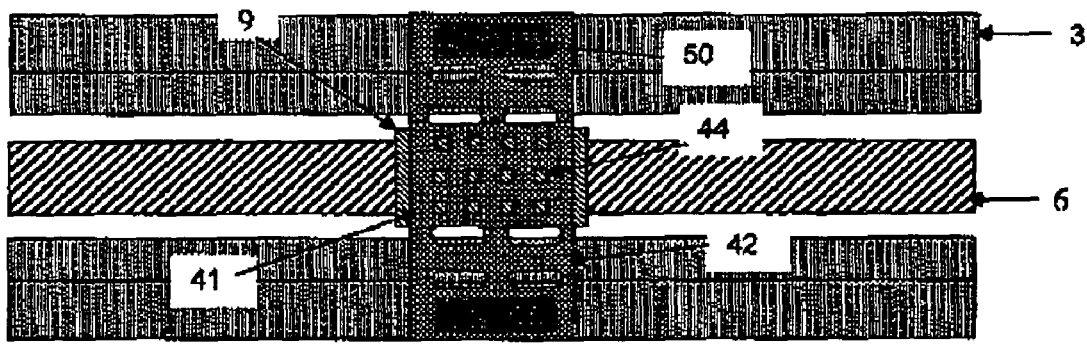

FIG. 13c shows cross sectional view of a six-step stepping actuator, wherein the two stepped fixed electrodes 80 are biased differently so that the two sides of the suspended electrode are lowered to different extents, giving rise to a tilt in the main suspended electrode 41. This constitutes a tilt actuator. If the stepped fixed electrode 80 in FIG. 13a form infinite steps, or a slope, as shown in electrode 72 in FIG. 14a, the actuator becomes an analog actuator where the gap varies continuously with applied bias. When a voltage is applied between the suspended side electrodes 70 and the fixed side electrodes 72, the suspended main electrode 41 moves to a position that is closer to the fixed signal electrode 6, as shown in FIG. 14b. It is noted that the MEMS RF switch and actuators described herein can be fabricated and packaged by the manufacturing method described in Steps 1a thru 12a (FIGS. 9a through 9n).

The suspended main electrode 41 in the exemplary RF switches are rectangular bridges having support pillars on both ends. It is conceivable that they are circular drums with support on all sides, or rectangular cantilevers with support on only one end, as most many prior-art RF switches.

If the suspended main electrode 41 in the RF switches or actuators described in FIGS. 10 through 14c comprises optical mirror or filter, the RF switches or actuators can function as phase modulator or light steerer, noting the switching electrode can both displaced (FIG. 13c) or tilted (FIG. 13d). Thus the RF switches or actuators can become optical switches such as tunable spatial light modulator or steering mirror. One specific example is tunable Fabry-Perot filter, formed by replacing both the suspended main electrode 41 and the fixed signal electrode 6 with multiplayer dielectric mirrors. The gap between the two mirror can be varied to control the wavelength of the light that can pass through. This has implications in tunable filters for hyperspectral imaging applications, wherein an focal plane array is placed behind the filter for measuring the filtered images at various wavelengths. While the present invention has been described in terms of its preferred embodiments, it will be apparent to those skilled in the art that various changes can be made to the disclosed embodiments without departing from the scope of the invention as set forth in the following claims. For instance, shape the suspended membrane need not be rectangular, it may be circular, wherein the side actuators may be a donut. The teachings set forth herein may be used in many other micro-electro-mechanical devices or microelectronic circuits and fields of endeavor, including flow sensors, flow controllers, gyroscopes, accelerometers, yaw sensors, force sensors, diaphragm-type actuators, resonating devices, telecommunication devices (such as mechanical filters, oscillators, etc.), and optical devices such as infrared detectors, CCD cameras, and flat-panel displays. It should also be understood that all terms relating to direction, shape, and geometry, and references to an suspended or lower surface (or the inside and outside) of a component are used only as exemplary and are not meant to limit the invention to any particular configuration or to use in any particular orientation.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

All cited patent documents and publications in the above description are incorporated herein by reference.

What is claimed is:

1. A method of manufacturing a plurality of micro enclosures on a substrate wafer, comprising steps of:
   (1) bonding a cap wafer to said substrate wafer with an adhesive layer to form the top and the bottom of said micro enclosures;
   (2) patterning and etching said cap wafer and said adhesive layer to form islands of layers of said cap wafer and said adhesive layer on said substrate wafer; and
   (3) depositing and patterning at least one metal layer to cover the outer sidewall surfaces around said islands, including the sidewall surfaces of said cap wafer and said adhesive layer, to form sidewall of said enclosures.

2. The method of claim 1, further comprising the steps of:
   (1) patterning and etching etch access holes in said cap wafer of said enclosures;
   (2) removing said adhesive layer through said etch access holes from said enclosures; and
   (3) sealing said etch access holes with deposited films.

3. The method of claim 1, wherein said etching is accomplished with high-density plasma that contains hydrogen or argon.

4. The method of claim 1, wherein said substrate wafer comprises one or more of following:
   micro-electro-mechanical device,
   polymeric sacrificial layer,
   polymeric planarizing layer,
   microelectronic circuit,
   and electrical component,
prior to said bonding.

5. The method of claim 1, further comprising a step of depositing getters on said cap wafer prior to said step (1) of bonding a cap wafer to said substrate wafer with an adhesive layer and subsequent heat activation of said getters.

6. The method of claim 2, wherein said deposited films comprises gas gettering materials.

7. The method of claim 6, wherein said gettering materials comprises $TiN_xO_y$ and/or $TiNx$.

8. The method of claim 2, wherein in said sealing is done under controlled gas pressure environment comprising high vacuum or inert gas.

9. The method of claim 2, wherein said enclosures form pressure transducers.

10. The method of claim 1, wherein said enclosures form vacuum or hermetic packaging for micro-electro-mechanical devices.

11. The method of claim 2, wherein said removing said adhesive layer is by etching with oxygenated plasma.

12. Said etching in claim 11 removes organic polymer or sacrificial layer in said enclosures.

13. The method of claim 1, wherein said depositing at least on metal layer is by physical vapor deposition, plating, electroplating, or chemical vapor deposition.

14. The method of claim 1, further comprises planarizing said substrate wafer prior to said bonding, comprising steps of:
   coating said wafer with a thick epoxy layer;
   curing said epoxy layer by heat or ultraviolet light; and thinning said epoxy layer to the desired thickness by lapping, grinding or polishing.

15. The method of claim 14, wherein said thick epoxy layer fills holes, cavities, troughs, or underside space of suspended structures.

16. The method of claim 15, further comprising the step of placing said wafer under a vacuum during or after said coating.

17. The method of claim 1, wherein said adhesive layer is disposed by spinning and said spinning is at speed of between 1500 rpm to 7000 rpm for less than 2 seconds.

18. The method of claim 1, wherein said adhesive layer comprises Abocast 50-24 epoxy resin from Abatron, Incorporated, Kenosha, Wis. 53144 USA.

* * * * *